United States Patent
Ho et al.

(10) Patent No.: US 6,905,621 B2
(45) Date of Patent: Jun. 14, 2005

(54) METHOD FOR PREVENTING THE ETCH TRANSFER OF SIDELOBES IN CONTACT HOLE PATTERNS

(75) Inventors: Bang-Chein Ho, Hsin-Chu (TW); Jian-Hong Chen, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 254 days.

(21) Appl. No.: 10/268,586

(22) Filed: Oct. 10, 2002

(65) Prior Publication Data

US 2004/0069745 A1 Apr. 15, 2004

(51) Int. Cl.$^7$ ................................ B44C 1/22
(52) U.S. Cl. ................ 216/47; 216/17; 216/18; 216/41; 430/5; 430/322; 430/323; 438/706; 438/725
(58) Field of Search ............... 216/17, 18, 41, 216/47, 67; 438/706, 725; 430/5, 322, 323

(56) References Cited

U.S. PATENT DOCUMENTS

| | | | |
|---|---|---|---|
| 5,017,461 A | 5/1991 | Abe | 430/325 |
| 5,178,976 A * | 1/1993 | Rose et al. | 430/5 |
| 5,532,113 A | 7/1996 | Fréchet et al. | 430/296 |
| 5,536,616 A | 7/1996 | Fréchet et al. | 430/191 |
| 5,648,196 A | 7/1997 | Fréchet et al. | 430/270.1 |
| 5,998,092 A | 12/1999 | McCulloch et al. | 430/270.1 |
| 6,362,113 B1 * | 3/2002 | Wang | 438/738 |
| 6,391,794 B1 * | 5/2002 | Chen et al. | 438/745 |
| 6,420,073 B1 * | 7/2002 | Suleski et al. | 430/5 |
| 6,455,417 B1 * | 9/2002 | Bao et al. | 438/637 |
| 6,664,028 B2 * | 12/2003 | Hwang et al. | 430/312 |
| 6,680,150 B2 * | 1/2004 | Blatchford et al. | 430/5 |

OTHER PUBLICATIONS

Yung-Tin Chen et al., "Optimization of Attenuated Phase Shift Mask for Contact Hole Printing," *SPIE Conference on Optical Microlithography XII*, Mar., 1999, pp. 812–820.

* cited by examiner

Primary Examiner—Shamim Ahmed
(74) Attorney, Agent, or Firm—Thomas, Kayden, Horstemeyer & Risley

(57) ABSTRACT

A method is provided for removing sidelobes that are formed when patterning a positive photoresist layer with an Att. PSM, Alt. PSM or a binary mask with scattering bars. A water soluble negative tone photoresist is coated over the positive photoresist pattern and is exposed through a mask having small islands that correspond in shape, size and location to the small holes in the mask used to pattern the positive tone photoresist. After development, exposed negative tone photoresist covers sidelobes formed by the positive tone process. The negative tone photoresist functions as a mask for a subsequent etch transfer of the positive tone pattern into the substrate. A method of aligning openings in a positive tone pattern over the same openings in a negative tone pattern is also useful in preventing sidelobes in the positive tone photoresist from being transferred into the substrate.

36 Claims, 5 Drawing Sheets

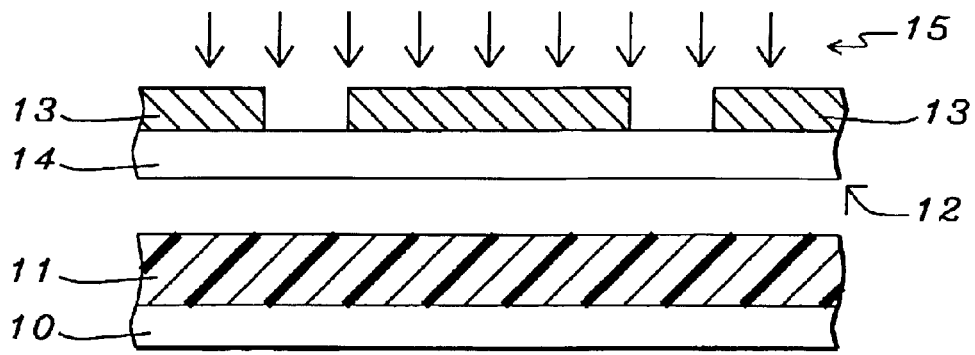
FIG. 1a – Prior Art
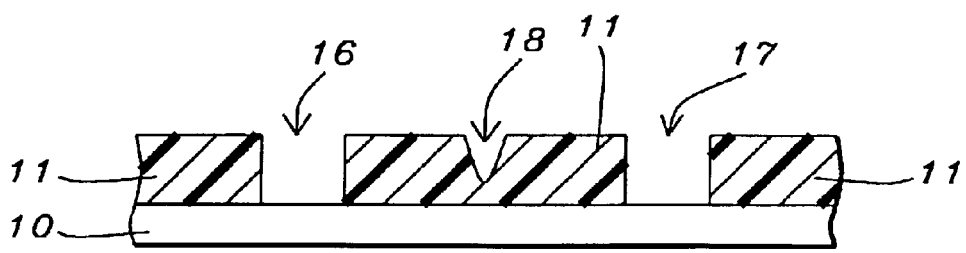
FIG. 1b – Prior Art
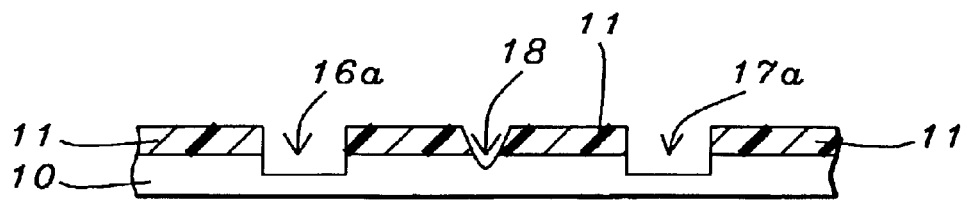
FIG. 1c – Prior Art
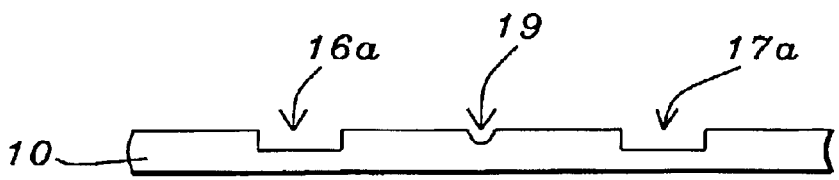
FIG. 1d – Prior Art

METHOD FOR PREVENTING THE ETCH TRANSFER OF SIDELOBES IN CONTACT HOLE PATTERNS

FIELD OF THE INVENTION

The invention relates to a method of fabricating an integrated circuit in a semiconductor device. More particularly, the present invention relates to a method of forming a pattern in a substrate that is free of surface damage or divots caused by an etch transfer of sidelobes from a photoresist layer.

BACKGROUND OF THE INVENTION

Photoresist patterning is a key step in the formation of integrated circuits in semiconductor devices. A photoresist layer is typically spin coated on a substrate and patternwise exposed by employing an exposure tool and a mask that contains a device pattern. Radiation is transmitted through transparent regions of the mask to selectively expose portions of the photoresist layer which are later developed in a media such as aqueous base to produce a photoresist pattern on the substrate. Each technology generation or node in the microelectronics industry is associated with a particular minimum feature size in the photoresist pattern. As technology advances have been continuous in recent years, the minimum feature size requirement has rapidly shifted from 250 nm to 180 nm and then to 130 nm. New products are now being developed for a 100 nm technology node.

Some of the more common features that are printed in photoresist layers are contact holes and line/space arrays in which line and space widths can occur in various sizes. The patterned photoresist generally functions as a mask for a subsequent etch step in which the device pattern is transferred into the substrate. Optionally, it can be employed as a mask for an ion implant process. The minimum resolution that can be achieved in a printed pattern is defined by the equation $R=k\lambda/NA$ where R is the minimum feature size that can be resolved, k is a constant, $\lambda$ is the exposure wavelength, and NA is the numerical aperture of the exposure tool. While exposure tools having mercury lamps that emit g-line (436 nm) or i-line (365 nm) radiation have been widely used in the industry, the trend in newer technologies is to move to shorter wavelengths such as 248 nm from KrF excimer lasers or 193 nm from ArF excimer lasers to achieve smaller feature sizes. In the near future, 157 nm radiation from $F_2$ lasers and 13 to 14 nm wavelengths from extreme ultraviolet radiation (EUV) sources will be available.

Commercial photosensitive compositions are available in two general types that are referred to as positive tone and negative tone formulations. In positive tone photoresist, exposed regions become soluble in a developer solution that is typically an aqueous base. Unexposed regions in the film remain insoluble in the developer and remain on the substrate. For negative tone photoresists, exposed regions become insoluble in a developer while the unexposed regions remain soluble and are washed away. The thickness of the photosensitive film can vary from about 0.2 microns to several microns. As a general rule, the film thickness is about 3 or 4 times the size of the minimum space width or line width. Therefore, to print a 100 nm contact hole, a 300 to 400 nm thick film is desirable in order to have a process latitude that is manufacturable.

Most state of the art positive and negative tone photoresists operate by a chemical amplification mechanism in which a photosensitive component absorbs energy from the exposing radiation and generates a strong acid. One acid molecule is capable of removing many polymer protecting groups in a positive tone mechanism or initiating several crosslinking reactions in a negative tone composition. A post-exposure bake is usually required to drive the reactions to completion within a few minutes so that the process is compatible with a high throughput manufacturing scheme. Chemically amplified (CA) photoresists are especially compatible with Deep UV radiation from a 248 nm excimer laser or from a Xe/Hg lamp that is filtered to transmit primarily 240 nm to 260 nm wavelengths. CA photoresists are also useful with sub-240 nm wavelengths.

The negative tone imaging process can involve a crosslinking mechanism or a polarity change to render the exposed regions insoluble in developer. Crosslinking occurs when a photo generated acid catalyzes bond formation between two polymer chains or between a polymer and an additive containing reactive groups. Depending on the molecular weight (MW) of the original polymers, a few crosslinks are all that might be needed to convert a soluble polymer into an insoluble network of polymers. This solubility difference is the basis for forming a pattern in an exposed negative tone film. Optionally, a solubility difference can be achieved if the photo generated acid induces a change within the polymer. For example, a polar polymer containing hydroxy groups can react with acid in exposed regions to lose its polar functionality by rearranging or by cleaving into two or more parts and thereby become insoluble in developer solution.

Traditionally, photoresists have been formulated in organic solvents, but recently water based formulations that are more environmentally compatible have been developed. U.S. Pat. No. 5,017,461 describes a water soluble negative tone composition based on a polyvinyl alcohol (PVA) and an acid generator that is a diazonium salt. An hydroxyl group on the polymer reacts with the diazonium salt to form an ether and liberate nitrogen and HCl. When the film is heated, HCl induces the polymer to lose a molecule of water and form an alkene that is insoluble in water developer.

Another water soluble negative tone photoresist that does not rely on a crosslinking mechanism is provided in U.S. Pat. No. 5,998,092. A photoacid reacts with an acetal group on a polymer side chain to produce a B-keto acid that loses $CO_2$ to form a polymer which is insoluble in aqueous base developer. This composition is especially useful in avoiding swelling in aqueous developer.

Individual components of negative tone photoresists have been developed that possess water solubility as an added property. For example, a water soluble sugar is claimed as an improved crosslinker in related U.S. Pat. Nos. 5,532,113 and 5,536,616. This crosslinker is used in combination with a p-hydroxystyrene polymer and a triphenylsulfonium salt that are not soluble in water and have an optical absorbance that is most suitable for 248 nm exposures. The pattern is developed in aqueous base. In U.S. Pat. No. 5,648,196, a water soluble photoacid generator (PAG) is described and is formulated with a p-hydroxystyrene polymer and a water soluble sugar. Either water or aqueous base developer is acceptable. The PAG is preferably a dimethylarylsulfonium salt wherein the aryl group has one or more hydroxy substituents.

A good lithography process, whether it involves a negative or positive tone material, is characterized by its process latitude. An acceptable process window for manufacturing depends on the minimum feature size but generally a depth of focus (DOF) of at least 0.5 to 1 micron and an exposure latitude of greater than 10% are desired for sub-micron feature sizes. In other words, the best focus setting may drift from 0.5 to 1 micron because of topography or reflectivity variations on the substrate and the dose delivered by the exposure tool may vary by up to 10% but the resulting feature size can still be maintained within a +/−10% tolerance of the intended linewidth or space width.

The patterning of contact holes for current and next generation devices is a difficult challenge for lithography engineers. A major concern is the inadequate DOF for small contact holes. Although exposure tools with higher NA are expected to improve the exposure latitude and resolution capability, DOF will be reduced according to the equation, $DOF=\lambda/(NA)^2$. Various process techniques such as attenuated phase shift masks (Att. PSM), high transmission Att. PSM, and scattering bar (SB) technology have been developed and applied to improve the process window for printing contact holes by optical lithography. Unfortunately, these methods induce a sidelobe pattern in the photoresist and surface damage that will cause damage to the device during a subsequent etch transfer step.

Sidelobe formation is more likely to occur under conditions when a photoresist is slightly overexposed or if the photoresist has a tendency to lose film thickness in unexposed areas during development. It should be noted that "unexposed" photoresist regions do receive a small dose of stray light because of an imperfect aerial image from the mask. As a result, there is a small film thickness loss in unexposed regions after pattern development which can vary from a few Angstroms to several hundred Angstroms. Since the exposure latitude is restricted because higher doses tend to cause sidelobe formation, the process latitude is further reduced over the loss from a higher NA or lower $\lambda$ as predicted in the equation, $DOF=\lambda/(NA)^2$.

Yung-Tin Chen, Ya-Chi Wang, and Ron Chu reported in "Optimization of Attenuated Phase Shift Mask for Contact Hole Printing" presented in SPIE Conference on Optical Microlithography XII, March, 1999, pages 812–820, that a pretreatment of an i-line (365 nm photosensitive) resist which removes part of the film thickness before exposure can extend the exposure latitude before sidelobe formation occurs. They also mention that the effect of exposure tool NA and sigma (partial coherence) have a different effect on the onset of sidelobes for isolated contact holes and dense contact holes.

A cross-sectional view of a prior art process in which a side lobe is formed and transferred into a substrate is shown in FIGS. 1a–1d. A substrate 10 is provided that typically contains active and passive devices in a substructure not shown in order to simply the drawing. Optionally, an anti-reflective coating (not shown) is formed on substrate 10 in order to control reflectivity during photoresist patterning. Then a positive tone photoresist is spin coated and baked to form photoresist layer 11. A reticle 12 having a patterned opaque coating 13 and a transparent substrate 14 is positioned between the radiation source (not shown) and the substrate 10. A single wavelength or broad band of wavelengths 15 is emitted by the source and passes through transparent substrate 14 not covered by opaque coating 13 on reticle 12. Reticle 12 can be an Att. PSM, an alternating phase shift mask (Alt. PSM) or a binary mask comprised of only chrome on quartz.

The exposed photoresist 11 is post exposed baked and then developed in an aqueous base solution to form the pattern shown in FIG. 1b. Because of a combination of conditions including illumination settings, type of mask, contact hole design, and other factors, a sidelobe 18 is formed between contact holes 16 and 17. The pattern is etch transferred into substrate 10 as shown in FIG. 1c. Although photoresist 11 is an etch mask, its thickness is reduced during the etch process. Then photoresist 11 is stripped to leave a pattern in substrate 10 that includes the desired contact holes 16a and 17a. However, since sidelobe 18 extended deep into photoresist 11, the film thickness below sidelobe 18 was not sufficient to prevent the etch from penetrating into substrate 10 and forming an unwanted divot 19 as depicted in FIG. 1d that will cause a degradation in device performance. Even if the sidelobe in FIG. 1c is found by optical inspection of the substrate and the etch step is not allowed to proceed, the substrate must be reworked by stripping the photoresist and repeating the patterning step. These unplanned steps drive a higher cost for the device and result in a disruption in normal process flow through the manufacturing line. Attempts to minimize the sidelobe will only result in a smaller process window that will lead to a higher amount of rework in succeeding batches of substrates.

Besides the single layer photoresist shown in FIGS. 1a–1d, a bilayer or trilayer patterning scheme is possible. In a bilayer design, a thin photosensitive composition is coated on a thicker underlayer that is not photosensitive. The pattern that is formed in the top layer is etch transferred through the bottom layer and then into the substrate. A bilayer method is especially effective when the substrate has topography or if a single layer resist does not provide enough etch resistance for an etch transfer process. With a trilayer method, a third layer is typically inserted between the top and bottom layer of a bilayer scheme. The extra layer is not photosensitive and normally provides added etch resistance. A top photosensitive layer is involved in both bilayer and trilayer schemes and is subject to the same sidelobe formation tendency as in a single layer process because the illumination conditions, mask, and contact hole design that contribute to sidelobe formation in a single layer photoresist have not changed.

Therefore, a method which can solve the sidelobe problem without reworking the substrate or reducing process window is needed. The method should accommodate a wide variety of exposure wavelengths as well as different types of masks and photoresist materials. Ideally, a method is needed that is compatible with single layer, bilayer or trilayer patterning schemes.

SUMMARY OF INVENTION

One objective of the present invention is to provide a method of preventing sidelobes in a photoresist pattern from being transferred into a substrate in a plasma etch process.

A further objective of the present invention is to provide a method of preventing sidelobes from being etch transferred that is compatible with a variety of photoresist materials including 365 nm, 248 nm, 193 nm, 157 nm and EUV sensitive compositions wherein said sidelobes are formed in single layer, bilayer, or trilayer schemes.

A still further objective of the present invention is to provide a method for transferring a photoresist pattern into a substrate that does not require stripping the photoresist and reworking the substrate.

A still further objective of the present invention is to provide a method that enables a larger process window for printing contact hole patterns.

These objectives are achieved with a process that involves a first mask pattern for printing fine holes and fine spaces.

The mask type can be an Att. PSM, an Alt. PSM, or a binary mask with scattering bars to increase the process window of the lithography method. In one embodiment, the mask is largely comprised of opaque regions having small transparent holes. A positive tone photoresist that consists of a 365 nm, 248 nm, 193 nm, 157 nm or EUV (13 nm) photosensitive composition is coated on a substrate and exposed through the mask with one or more wavelengths selected from a range of about 10 nm to about 600 nm. In addition to the holes and spaces that are printed to replicate the mask design, unwanted sidelobes are frequently formed between holes as shown in FIG. 2b.

A second photoresist comprised of a water soluble negative tone composition is coated on the pattern formed by the first photoresist and fills contact holes and sidelobes and forms a second photoresist layer above the first photoresist layer. In one embodiment, the water soluble negative tone photoresist consists of a polymer such as poly(vinylacetal), a crosslinker which is ethylene urea, a photoacid generator (PAG), water as a solvent, and a quencher that acts as an acid scavenger to prevent undesired crosslinking while the photoresist solution is stored in a container prior to spin coating.

A second mask is then employed which is largely a transparent substrate except for small opaque regions that correspond in size and shape to the transparent openings in the first mask. The water soluble negative tone photoresist is then exposed through the second mask with one or more wavelengths selected from a range of about 10 nm to 600 nm and crosslinks except in unexposed regions over the holes formed in the first photoresist by the first exposure. The negative resist is typically post-exposure baked, and developed in water or a water/isopropanol mixture to form holes in the second photoresist that are aligned above the holes in the positive tone resist layer. In addition, the developer removes the unexposed negative tone photoresist that filled the holes in the first layer. Sidelobes that were formed in the positive tone photoresist remain covered by crosslinked negative tone photoresist. This crosslinked layer stays on the positive tone photoresist layer during the etch transfer step and serves as an etch mask so that the etch does not punch through the area of the sidelobe and form a divot in the substrate. Once the etch transfer is complete, both negative tone and positive tone photoresists are stripped at the same time by a method which involves using an $O_2$ plasma ash or with a wet stripper. A conventional cleaning process then follows.

In a second embodiment, a negative tone photoresist is patternwise exposed to form a crosslinked polymer matrix on a substrate. The pattern contains holes or spaces. A positive tone photoresist is then coated on the negative photoresist pattern to fill the holes and spaces and form a second layer over the first photoresist layer. A second mask is then employed which transmits light that exposes the positive photoresist only in regions aligned above the holes in the underlying layer. The exposed resist is developed to provide a pattern with holes or spaces that are formed above the holes in the negative photoresist layer. Although sidelobes may be formed in the positive photoresist layer, they are not etch transferred into the substrate because the extra thickness provided by the negative photoresist offers enough etch resistance to prevent a punch through into the substrate.

With this method, a larger process window is realized for the second photoresist patterning step since some conditions such as higher exposure dose and marginal focus settings that previously printed unwanted sidelobes are now allowed because a buffer layer can be formed under the sidelobes that prevents their transfer into the substrate in a subsequent etch step.

BRIEF DESCRIPTION OF THE DRAWINGS

FIGS. 1a–1d are cross-sectional views of a prior art method in which sidelobes are formed in a photoresist layer and transferred into a substrate.

DETAILED DESCRIPTION OF THE INVENTION

Figure 2A:
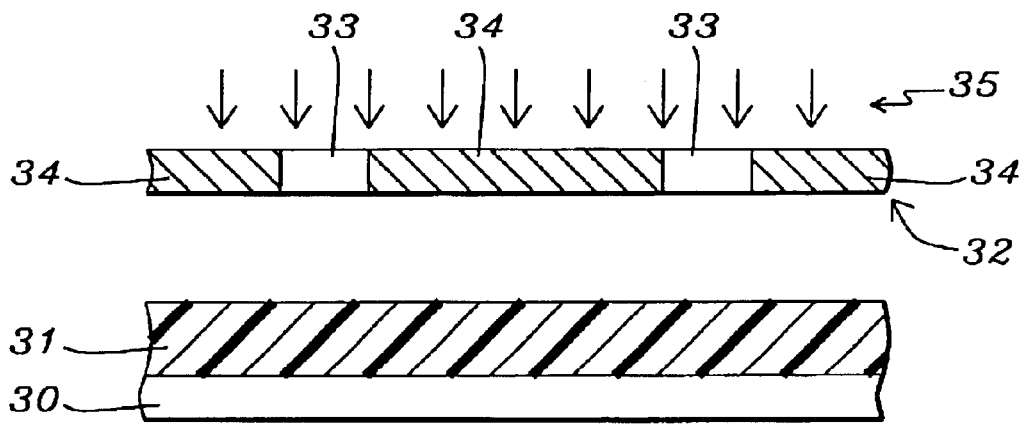
FIGS. 2a–2b and FIGS. 2d–2g are cross-sectional views and FIG. 2c is a top-down view illustrating one embodiment of the present invention.

The present invention is a method of fabricating an integrated circuit which involves patterning photoresist layers and transferring an opening in the pattern into a substrate.

In the first embodiment as illustrated in FIGS. 2a–2f, a substrate 30 is provided that typically contains active and passive devices in a substructure that is not shown in order to simply the drawing and direct attention to the present invention. Optionally, an anti-reflective coating or ARC (not shown) is formed on substrate 30 in order to control reflectivity during a subsequent photoresist patterning process. The ARC can be an inorganic material like silicon nitride or silicon oxynitride that is deposited by a chemical vapor deposition (CVD) process or the ARC can be an organic layer that is obtained by spin coating and baking a commercially available material. A typical thickness for an ARC is between about 300 and 1000 Angstroms.

Referring to FIG. 2a, a positive tone photoresist from a commercial supplier is spin coated and baked to form photoresist layer 31 which normally has a thickness in the range of about 2000 to 10000 Angstroms. The photoresist thickness is usually determined by the minimum feature size in the device pattern to be printed in photoresist layer 31. However, the thickness of layer 31 is also influenced by the etch rate ratio of photoresist 31 to substrate 30 and the depth to which a hole in the photoresist pattern is etch transferred into substrate 30 in a later step represented in FIG. 2e. As a general rule, the thickness of photoresist layer 31 is about 3 to 4 times the size of the minimum feature in the photoresist pattern which in this embodiment is the width of holes or spaces 36, 37 shown in FIG. 2b.

The type of photoresist 31 selected also depends on the dimension of the smallest feature to be printed by the lithographic process. Deep UV radiation from a single wavelength (248 nm) excimer laser or from a broadband (240–260 nm) source is preferred for feature sizes from about 130 nm to about 300 nm while a 193 nm exposure wavelength is often selected for feature sizes from about 100 nm to about 130 nm. A 365 nm wavelength is generally employed for exposing photoresist layers when the minimum feature is greater than about 300 nm. Although the drawings for this embodiment depict a single layer imaging scheme, it should be understood that a bilayer or trilayer scheme having a positive tone photoresist as the top layer is also included within the scope of this invention.

Referring to FIG. 2a, an exposure 35 through patterned mask 32 is transformed into an aerial image that is used to print holes or spaces in photoresist 31. In the case of an att-PSM or alt-PSM, regions 33 and 34 transmit light that is 180° out of phase with an adjacent region. When mask 32 is a binary mask, region 34 represents an opaque region while region 33 is transparent to the exposing light. In addition, mask 32 may contain scattering bars to increase the process window of the patterning method. Radiation 35 from an exposure source (not shown) passes through regions 33 to expose photoresist 31. Other resolution enhancement techniques such as off-axis illumination may be applied. Although 193 nm, 248 nm, and 365 nm exposure tools are preferred for most current lithography applications, it should be understood that any exposure wavelength in the range from about 10 nm to about 600 nm is included in the scope of this invention.

When the photoresist 31 is a chemically amplified material, the substrate 30 is typically baked after exposure and is preferably developed with an aqueous base solution. If the photosensitive composition is sensitive to 365 nm or 435 nm radiation and consists of a diazonaphthoquinone in Novolak resin, the photoresist 31 does not need to be baked after exposure. In either case, unwanted sidelobes are likely to form between the holes or spaces in the photoresist pattern because of a combination of illumination conditions, mask, and photoresist characteristics.

Figure 2B:
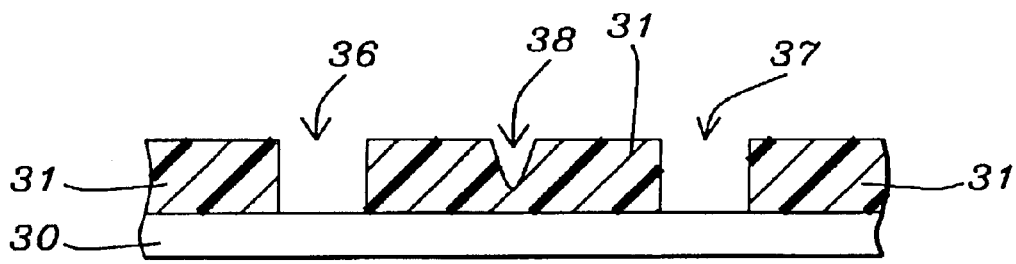

In FIG. 2b, sidelobe 38 is formed between hole 36 and hole 37. The size of sidelobe 38 may vary depending on exposure conditions. Sidelobes in other parts of the photoresist pattern that are not shown in FIG. 2b may be larger or smaller than sidelobe 38. However, the present invention is versatile in that it can be successfully applied to various sizes of sidelobes in the same pattern. Furthermore, holes 36, 37 may form opposite corners of a square comprised of a hole in each corner as shown in a top-down view in FIG. 2c. Line A represents the cut used to provide the cross-sectional view in FIG. 2b. Other adjacent holes in the pattern may not have a sidelobe formed between them. For example, there is no sidelobe between hole 39c and hole 39d and no sidelobe between hole 37 and hole 39d. The method is also versatile since it can be successfully applied without knowing where sidelobes have formed in the photoresist pattern. In other words, the method of this invention can be practiced without determining beforehand where sidelobe defects occur in photoresist 31.

As shown in FIGS. 1a–1d, if an etch transfer of a positive tone photoresist pattern containing a sidelobe is performed at this point, the etch can punch through the sidelobe to form an unwanted divot in the substrate that can degrade device performance. The corrective measure taken in prior art is to strip the patterned photoresist containing sidelobes and repeat the patterning process. However, this is a costly process and does not guarantee that the repeated process will be free of sidelobes.

Figure 2C:
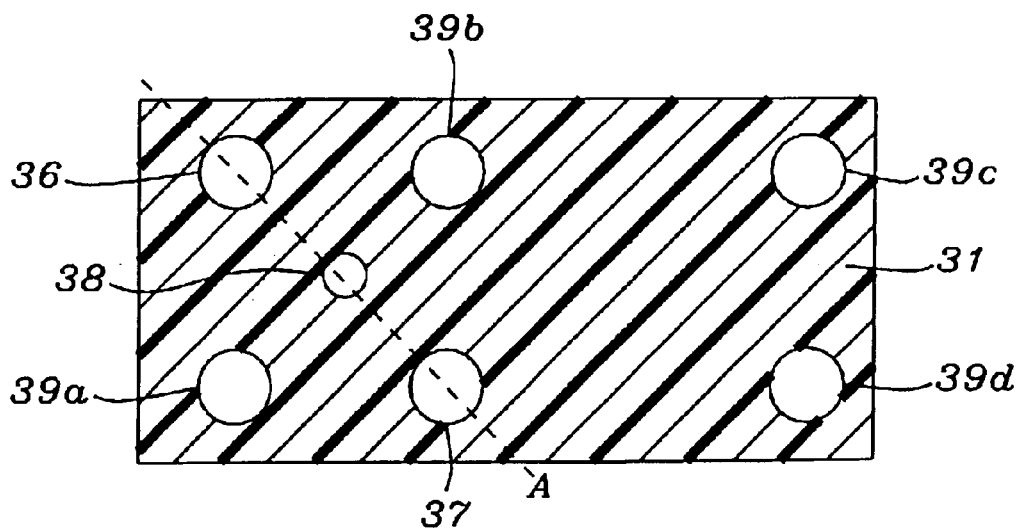
Figure 2D:
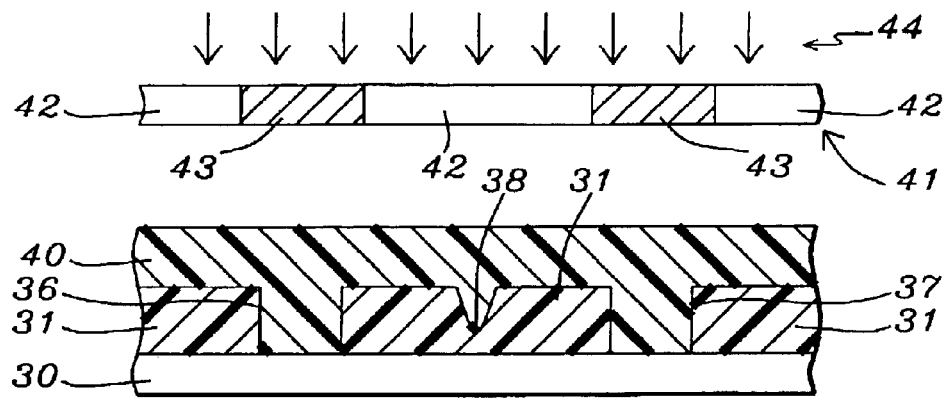

The inventors have discovered a corrective method for preventing sidelobes from being etch transferred into a substrate. A second photoresist is coated over patterned photoresist layer 31 to form photoresist layer 40 as illustrated in FIG. 2d. A key feature of this invention is that photoresist 40 is preferably a negative tone photoresist that does not mix with photoresist layer 31. In one example, photoresist 40 is a water soluble negative tone photoresist. However, negative tone photoresist 40 can also be coated from an organic solution that does not mix with patterned layer 31. Those skilled in the art can readily determine what solvents are compatible with this process. Photoresist layer 40 fills holes 36, 37, sidelobe 38, and other holes 39a–d as shown in FIG. 2c. The thickness of the negative photoresist 40 is sufficient to form a planar layer 40 and is preferably in the range of between about 1000 to 10000 Angstroms.

Photoresist 40 is comprised of a polymer, a crosslinker, a photoacid generator (PAG), and a quencher which is typically a non-nucleophilic base that acts as an acid scavenger to prevent crosslinking while the solution is stored in a container prior to spin coating. One particular formulation that is effective as photoresist 40 is a water solution with 4% to 8% poly(vinylacetal), 0.5% to 2% ethyleneurea as crosslinker, 0.01% to 0.1% PAG, and 1 to 30 ppm of a quencher. The PAG is selected from a group of compounds including onium salts, imidosulfonates, and diazonium sulfonates. An appropriate PAG can be selected to function at any of the exposure wavelengths mentioned previously that include 365 nm, 248 nm, 193 nm, 157 nm, and 13 to 14 nm (EUV). In some cases, especially for 365 nm exposures, a sensitizer is added to absorb energy from the exposing radiation and then transfer energy to the PAG. The quencher is usually an amine that does not react with the polymer or PAG but traps trace amounts of acid that might be present in the water solution. Preferred quenchers are well known to those skilled in the art and are not mentioned herein.

The photoresist 40 is exposed through a patterned mask 41. In the case of an att-PSM or alt-PSM, regions 42 and 43 transmit light that is 180° out of phase with an adjacent region. When mask 41 is a binary mask, region 43 represents an opaque region while region 42 is transparent to the exposing light. In addition, mask 41 may contain scattering bars to increase the process window of the patterning method. Radiation 44 from an exposure source (not shown) passes through regions 42 to expose photoresist 40. Other resolution enhancement techniques such as off-axis illumination may be applied. Although 193 nm, 248 nm, and 365 nm exposure tools are preferred for most current lithography applications, it should be understood that any exposure wavelength in the range from 10 nm to about 600 nm is included in the scope of this invention.

Figure 2E:
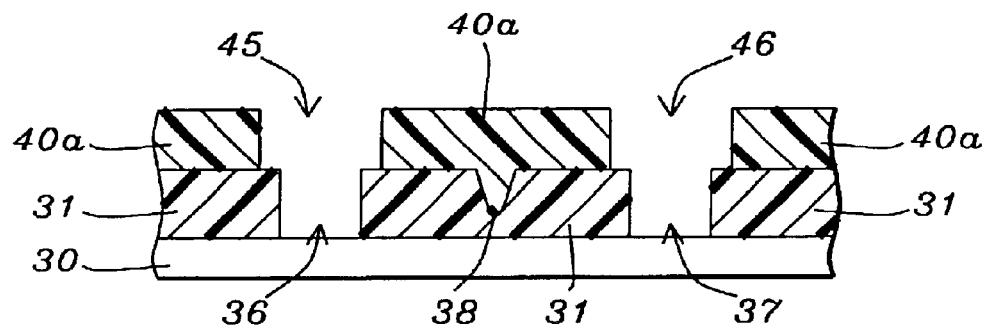

During the exposure and post-expose baking step, the photoresist 40 is crosslinked in exposed regions to be transformed into photoresist layer 40a as seen in FIG. 2e. The PAG generates a strong acid in exposed areas which catalyzes a reaction between the polymer and crosslinker to form a crosslinked network 40a that is no longer soluble in water. Therefore, when an aqueous or isopropanol/water developer is applied to substrate 30 following a post-expose bake, only unexposed regions of photoresist 40 are removed. Photoresist layer 40a remains on photoresist layer 31 and covers sidelobe 38. Openings 45 and 46 are formed in photoresist layer 40a and are aligned above holes 36 and 37, respectively, in photoresist layer 31.

Note that the width of holes 45, 46 may be larger than for holes 36, 37 to allow for some error in the overlay of the pattern in mask 41 on the pattern in photoresist layer 31. Therefore, it is not necessary to use the same wavelength of radiation for exposing negative tone photoresist 40 as was employed for exposing positive tone photoresist 31. Generally, it is more economical to use a longer exposing wavelength for the second exposure, if possible. For instance, a 193 nm wavelength might be used to pattern photoresist 31 to form holes 36, 37 between 100 and 130 nm in width while a 248 nm wavelength may be employed for exposing photoresist 40 to form holes 45, 46 that could be between 130 nm and 250 nm in width. The width of holes 45, 46 is limited by the distance between holes 36 and 37 in photoresist 31. The holes 45, 46 should also not be so large as to overlap the region containing sidelobe 38 in photoresist 31.

Figure 2F:
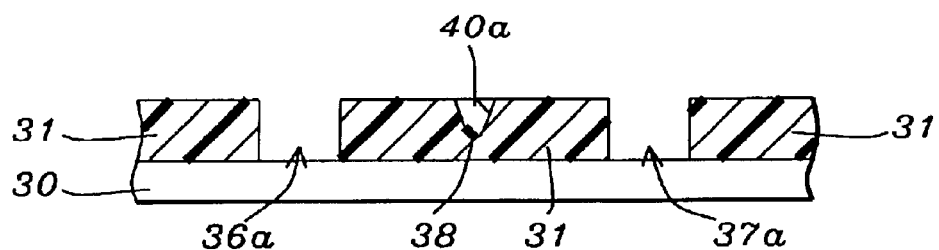
Figure 2G:
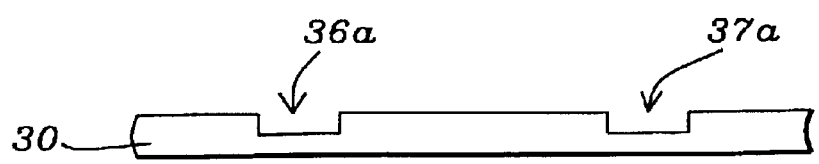

The substrate 30 is then anisotropically etched by an appropriate plasma etch method known to those skilled in the art that is determined by the material to be etched in substrate 30. Photoresist layers 31 and 40a function as an etch mask for the transfer of the pattern in photoresist 31 into substrate 30. Some or all of photoresist layer 40a and some of photoresist 31 are usually consumed during the etch process which when completed forms holes 36a and 37a in substrate 30 as shown in FIG. 2f. Note that the etch has not punched through sidelobe 38 because of the protection afforded by a covering of layer 40a. The final step is removing photoresists 31 and 40a by a stripping process which is uses $O_2$ plasma or a wet stripper followed by a conventional cleaning technique. As a result, substrate 30 in FIG. 2g contains two holes or spaces shown as 36a and 37a. There is no divot or surface damage in substrate 30 caused by sidelobes in the original photoresist 31 pattern because of the additional etch mask provided by a second photoresist layer 40a. Further processing is not pertinent to the present invention but may involve filling holes or spaces 36a, 37a with a dielectric or conductive material.

A method has been demonstrated whereby a hole or space pattern containing sidelobes in a photoresist layer is transferred into a substrate without causing surface damage such as divots. The method is compatible with a wide range of exposure wavelengths and lithography schemes and does not require expensive rework operations. Furthermore, the method enables the benefits such as a larger process window for printing contact holes of advanced technology methods including Att. PSM and Alt. PSM exposures to be realized without suffering from undesirable sidelobes often produced by these techniques.

Figure 3A:
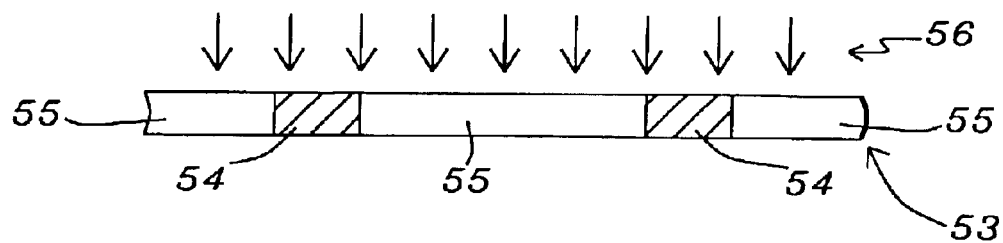
FIGS. 3a–3f are cross-sectional views of a second embodiment of the present invention.

In a second embodiment, a substrate 50 as depicted in FIG. 3a is provided that typically contains active and passive devices in a substructure that is not shown in order to simply the drawing and direct attention to the present invention. An anti-reflective coating or ARC 51 having a thickness between about 300 to about 1000 Angstroms is formed on substrate 50 in order to control reflectivity during a subsequent photoresist patterning process. The ARC 51 can be an inorganic material like silicon nitride or silicon oxynitride that is deposited by a chemical vapor deposition (CVD) process or the ARC can be an organic layer that is obtained by spin coating and baking a commercially available material. If ARC 51 is an organic material, its selection depends on the type of photoresist 52 and exposure wavelength 56 used in the patterning step. Normally, the refractive index (n and k) and thickness of ARC 51 is tuned to minimize reflectivity of the exposing radiation and is determined by the n and k of the photoresist 52.

A negative tone photoresist is spin coated on ARC 51 and baked to form photoresist layer 52 which normally has a thickness in the range of about 2000 to 10000 Angstroms. The photoresist thickness is usually determined by the minimum feature size in the device pattern to be printed in photoresist layer 52. However, the thickness of layer 52 is also influenced by the etch rate ratio of photoresist 52 to substrate 50 and the etch rate ratio of photoresist 52 to ARC 51 during a later etch transfer step. The depth to which an opening is etched into substrate 50 is also a consideration for the thickness of photoresist 52 as an etch mask. As a general rule, the thickness of photoresist layer 52 is about 3 to 4 times the size of the minimum feature in the photoresist pattern which in this embodiment is the width of openings 57, 58 shown in FIG. 3b. Since the negative photoresist film 52 will be crosslinked in a subsequent patterning process, film 52 may be spin coated from either a water or organic solution. The crosslinked pattern in exposed film 52a in FIG. 3b will be impervious to other organic materials that are subsequently coated on it.

The type of photoresist 52 selected also depends on the dimension of the smallest feature to be printed by the lithographic process. Deep UV radiation from a single wavelength (248 nm) excimer laser or from a broadband (240–260 nm) source is preferred for feature sizes from about 130 nm to about 300 nm while a 193 nm exposure wavelength is often selected for feature sizes from about 100 nm to about 130 nm. A 365 nm wavelength is generally employed for exposing photoresist layers when the minimum feature is greater than about 300 nm. Although the drawings for this embodiment depict a single layer imaging scheme, it should be understood that a bilayer or trilayer scheme having a negative tone photoresist as the top layer is also included within the scope of this invention.

As indicated in FIG. 3a, the photoresist 52 is exposed through a mask 53. In the case of an att-PSM or alt-PSM, regions 54 and 55 transmit light that is 180° out of phase with an adjacent region. When mask 53 is a binary mask, region 54 represents an opaque region while region 55 is transparent to the exposing light. In addition, mask 53 may contain scattering bars to increase the process window of the patterning method. Radiation 56 from an exposure source (not shown) passes through regions 55 to expose photoresist 52. Other resolution enhancement techniques such as off-axis illumination may be applied. Although 193 nm, 248 nm, and 365 nm exposure tools are preferred for most current lithography applications, it should be understood that any exposure wavelength in the range from 10 nm to about 600 nm is included in the scope of this invention.

When the photoresist 52 is a chemically amplified (CA) material, the substrate 50 is generally baked after exposure and is then preferably developed with an aqueous base solution. If the photoresist 52 is sensitive to 365 nm or 435 nm radiation and operates by a free radical mechanism initiated by a photosensitive component like a diazide, then a post expose bake may not be necessary. In this embodiment, a CA negative photoresist layer 52 is preferred for the initial patterning step and normally is comprised of a photoacid generator, a polymer, and a quencher. In the second embodiment, the negative photoresist 52 is patterned first since it may have better adhesion to the ARC 51 than a positive photoresist or negative photoresist 52 may be less susceptible to trace amounts of acid or base in ARC 51 that could interfere with the chemical amplification mechanism. Other reasons are known to those who are skilled in the art and are not discussed here.

Figure 3B:
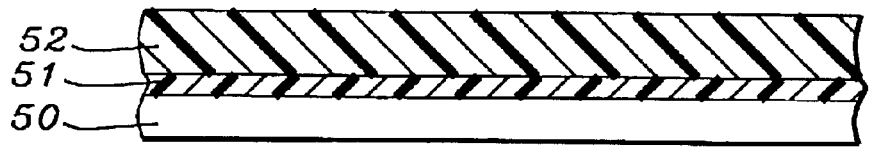

Referring to FIG. 3b, openings 57, 58 are formed in a crosslinked photoresist layer 52a. However, openings 57, 58 are not etch transferred into substrate 50 at this point because the openings may have rounded corners at the top of the sidewalls that can form non-vertical sidewalls in substrate 50. Another reason for not performing an etch transfer at this point could be that the crosslinked film 52a does not have enough etch resistance to enable the pattern to be transferred into substrate 50 with a wide process window. Optionally, a flood exposure step which does not use a patterned mask can be added here to ensure that layer 52a is entirely crosslinked and will not mix with organic materials that are subsequently coated on layer 52a. Flood exposure tools are available from Fusion Systems and other commercial suppliers. A post exposure bake step would preferably follow a flood expose process.

Figure 3C:
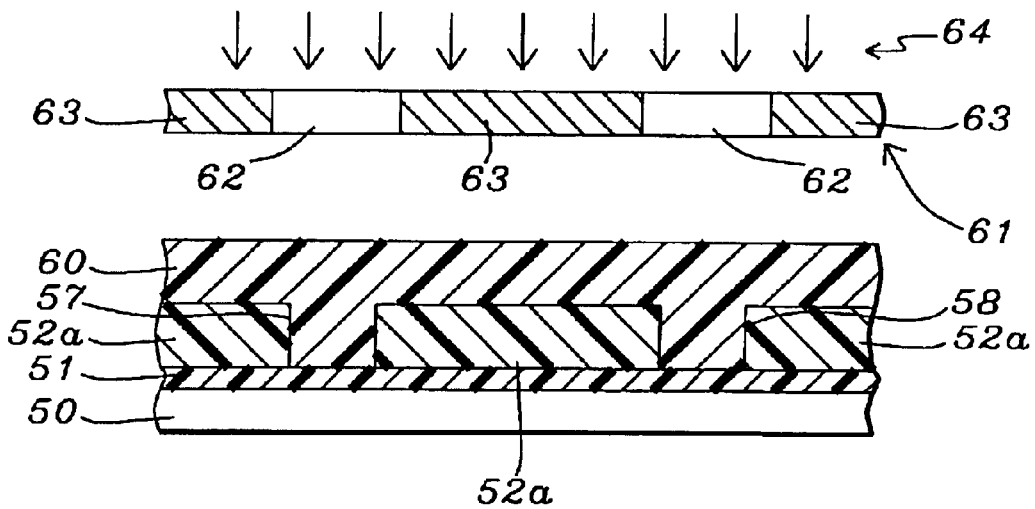

Referring to FIG. 3c, a positive tone photoresist is coated and baked to form photoresist layer 60 on patterned layer 52a. Since layer 52a is crosslinked, layer 60 does not mix with patterned layer 52a. Photoresist layer 60 fills holes 57, 58 and extends above layer 52a to a thickness of between about 1000 to 10000 Angstroms.

Positive tone photoresist 60 may be comprised of a diazonaphthoquinone photosensitive compound in Novolac resin or layer 60 can be a commercially available chemically amplified (CA) composition. For a CA photoresist 60 comprised of a PAG, a polymer with an acid labile group, and a quencher, an appropriate PAG can be selected to function at any of the exposure wavelengths mentioned previously that include 365 nm, 248 nm, 193 nm, 157 nm, and 13 to 14 nm (EUV). In some cases, especially for 365 nm exposures, a sensitizer is added to absorb energy from the exposing radiation and then transfer energy to the PAG. The quencher is usually an amine that does not react with the polymer or PAG but traps trace amounts of acid that might be present in the water solution. Preferred quenchers are well known to those skilled in the art and are not mentioned herein.

The photoresist 60 is exposed through a mask 61 and developed to form openings 65, 66. In the case of an att-PSM or alt-PSM, regions 62 and 63 transmit light that is 180° out of phase with an adjacent region. When mask 61 is a binary mask, region 63 represents an opaque region while region 62 is transparent to the exposing light. In addition, mask 61 may contain scattering bars to increase the process window of the patterning method. Radiation 64 passes through transparent regions 62 to expose photoresist layer 60. Other resolution enhancement techniques such as off-axis illumination may be applied. Although 193 nm, 248 nm, and 365 nm exposure tools are preferred for most current lithography applications, it should be understood that any exposure wavelength in the range from 10 nm to about 600 nm is included in the scope of this invention.

Figure 3D:
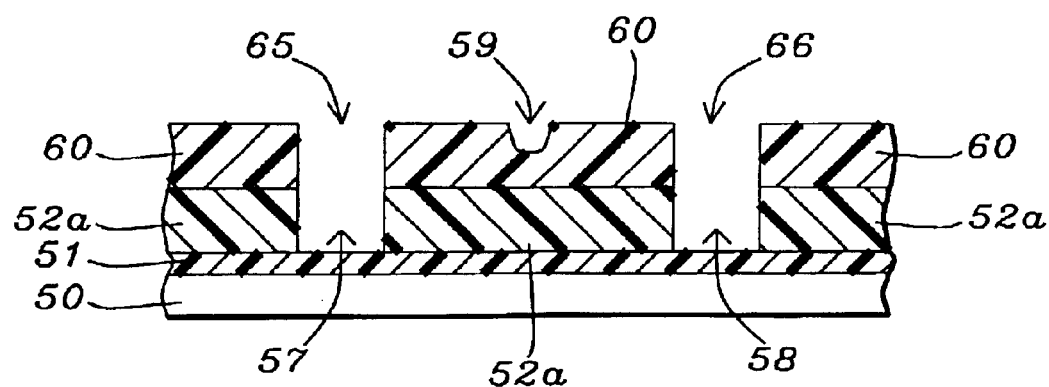

As shown in FIG. 3d, openings 65, 66 are formed in positive photoresist layer 60 and are aligned above holes 57 and 58, respectively, in photoresist layer 52a. In addition, unwanted sidelobes are likely to form between the openings in the photoresist layer 60 because of a combination of illumination conditions, mask, and photoresist characteristics. In this example, a sidelobe 59 is formed between openings 65, 66. The sidewalls of openings 65, 66 are aligned as close as possible over the sidewalls of openings 57, 58. Generally, openings in positive tone photoresist pattern have a squarer profile than those in negative tone photoresists and therefore provide a better etch mask.

Figure 3E:
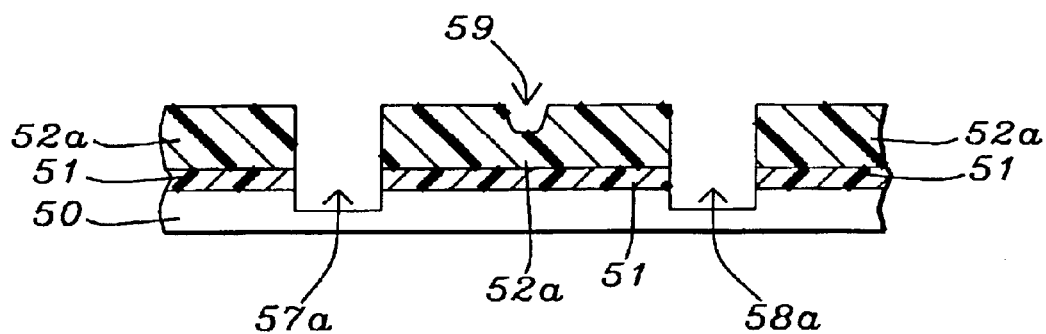

Referring to FIG. 3e, an ARC 51 open step is then performed with a plasma etch that typically involves oxygen if the ARC 51 is an organic layer. The etch removes ARC 51 exposed by openings 57, 58 and stops on substrate 50. Some of layer 60 is also removed during the etch through ARC 51. If a sufficient thickness of layer 60 is removed, sidelobe 59 is partially transferred into photoresist layer 52a. Usually, the etch rates of layers 51 and 60 are about equivalent. Since the thickness of layer 60 is typically much larger than the thickness of layer 51, a majority of layer 60 remains after the ARC 51 open etch step.

Next, the pattern in ARC 51 is anisotropically etched into substrate 50 by an appropriate plasma etch method known to those skilled in the art. Photoresist layers 52a and 60 function as an etch mask for the transfer of the pattern in ARC layer 51 into substrate 50. Some or all of photoresist layer 60 and some of photoresist 52a may be consumed during the etch process which when completed forms holes 57a and 58a in substrate 50. Note that in a less desirable case where layer 60 is completely removed, the etch does not punch through sidelobe 59 into substrate 50 because photoresist layer 52a provides a margin of thickness to prevent the transfer of sidelobe 59 into substrate 50. The final step is removing ARC 51 and photoresists 52a and 60 by a stripping process described in the first embodiment.

Figure 3F:
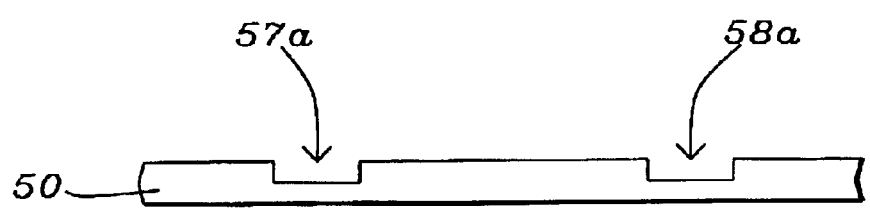

As a result, substrate 50 in FIG. 3f contains two holes or spaces shown as 57a and 58a. There is no divot or surface damage in substrate 50 caused by sidelobes in the original photoresist 60 pattern because of the additional mask provided by a second photoresist layer 52a. Further processing is not pertinent to the present invention but may involve filling holes or spaces 57a, 58a with a dielectric or a conductive material.

A method has thus been demonstrated whereby a hole or space pattern containing sidelobes in a photoresist layer is transferred into a substrate without causing surface damage such as divots. The method is compatible with a wide range of exposure wavelengths and lithography schemes and does not require expensive rework operations. Furthermore, the method enables the benefits of advanced technology methods such as exposures with Att. PSM and Alt. PSM to be realized without suffering from undesirable sidelobes often produced by these techniques.

While this invention has been particularly shown and described with reference to, the preferred embodiment thereof, it will be understood by those skilled in the art that various changes in form and details may be made without departing from the spirit and scope of this invention.

We claim:

1. A method for manufacturing a microelectronic structure comprising:

providing a substrate having a positive tone photoresist layer formed thereon;

patterning said positive tone photoresist layer with a first patterned mask to form first holes or spaces penetrating said positive tone photoresist layer and an unwanted sidelobe therein;

coating a negative tone photoresist layer on said positive tone photoresist layer to fill the sidelobe;

patterning said negative tone photoresist layer with a second patterned mask to form second holes or spaces that are aligned above said first holes or spaces in said positive tone photoresist layer; and transferring said first holes or spaces into said substrate.

2. The method of claim 1 wherein said positive tone photoresist layer is exposed with one or more wavelengths selected from a range of about 10 nm to about 600 nm.

3. The method of claim 1 wherein said first patterned mask is the same type as said second patterned mask and is selected from a group including attenuated phase shift masks (Att. PSM), alternating phase shift mask (Alt. PSM), and binary masks with scattering bars.

4. The method of claim 1 wherein said positive tone photoresist layer comprises a chemically amplified composition that requires a post exposure bake prior to development.

5. The method of claim 1 wherein said positive tone photoresist layer has a thickness between about 1000 to 10000 Angstroms.

6. The method of claim 1 wherein said positive tone photoresist layer is the top layer in a single layer, bilayer, or trilayer lithography scheme.

7. The method of claim 1 further comprised of an anti-reflective coating (ARC) that is formed on said substrate prior to coating said positive tone photoresist layer.

8. The method of claim 7 wherein the thickness of said ARC is between about 300 and 1000 Angstroms.

9. The method of claim 1 wherein said negative tone photoresist layer does not mix with said positive tone photoresist layer.

10. The method of claim 1 wherein said negative tone photoresist layer fills first holes and spaces in said positive tone photoresist layer and forms a thickness of from about 300 to 10000 Angstroms above said positive tone photoresist layer.

11. The method of claim 1 wherein said negative tone photoresist layer is exposed with one or more wavelengths of radiation in a range of about 10 nm to about 600 nm.

12. The method of claim 1 wherein said negative tone photoresist layer is comprised of a poly(vinylacetal), ethylene urea, a photoacid generator, water, and a quencher.

13. The method of claim 12 wherein said negative tone photoresist layer is developed with water or a water/isopropanol mixture.

14. The method of claim 1 wherein said second holes or spaces in said negative tone photoresist layer are wider than the first holes and spaces in said positive tone photoresist layer and expose the entire opening of said first holes or spaces in said positive tone photoresist layer.

15. The method of claim 7 wherein a first plasma etch step is used to transfer said first holes or spaces through said ARC layer and a second plasma etch step is used to transfer said first holes or spaces into said substrate.

16. The method of claim 11 wherein the one or more wavelengths used to expose said negative tone photoresist layer are the same or longer than the one or more wavelengths used to expose said positive tone photoresist layer.

17. A method for manufacturing a microelectronic structure comprising:

providing a substrate having a negative tone photoresist layer formed thereon;

patterning said negative tone photoresist layer with a first patterned mask to form first holes or spaces penetrating said negative tone photoresist layer;

thoroughly coating a positive tone photoresist layer on said negative tone photoresist layer to fill said first holes or spaces in said negative tone photoresist layer;

patterning said positive tone photoresist layer with a second patterned mask to remove a portion of said positive tone photoresist layer within said first holes or spaces and form second holes or spaces that are aligned above said first holes or spaces in said negative tone photoresist layer; and transferring said first holes or spaces into said substrate.

18. The method of claim 17 wherein said negative tone photoresist layer is exposed with one or more wavelengths selected from a range of about 10 nm to about 600 nm.

19. The method of claim 17 wherein said first patterned mask is the same type as said second patterned mask and is selected from a group including attenuated phase shift masks (Att. PSM), alternating phase shift mask (Alt. PSM), and binary masks with scattering bars.

20. The method of claim 17 wherein said negative tone photoresist layer comprises a chemically amplified composition that requires a post exposure bake prior to development.

21. The method of claim 17 wherein said negative tone photoresist layer forms a crosslinked layer after the patterning step which is immiscible with said positive tone photoresist layer.

22. The method of claim 17 wherein the thickness of said negative tone photoresist layer is between about 1000 to 10000 Angstroms.

23. The method of claim 17 wherein said negative tone photoresist layer is the top layer in a single layer, bilayer, or trilayer lithography scheme.

24. The method of claim 17 further comprised of an anti-reflective coating (ARC) that is formed on said substrate prior to coating said negative tone photoresist layer.

25. The method of claim 24 wherein said ARC layer has a thickness between about 300 and 1000 Angstroms.

26. The method of claim 17 wherein said positive tone photoresist layer forms a thickness of from about 300 to 10000 Angstroms above said negative photoresist layer.

27. The method of claim 17 wherein said positive tone photoresist layer is exposed with one or more wavelengths of radiation in a range of about 10 nm to about 600 nm.

28. The method of claim 17 wherein said second holes or spaces in said positive tone photoresist layer are about equivalent in width to said first holes or spaces in said negative tone photoresist layer and expose the entire opening of said first holes or spaces in said negative tone photoresist layer.

29. The method of claim 15 wherein a sidelobe is formed in said positive tone photoresist layer and located directly above said negative tone photoresist layer.

30. The method of claim 24 wherein a first plasma etch step is used to transfer said first holes or spaces through said ARC layer and a second plasma etch step is used to transfer said first holes or spaces into said substrate.

31. The method of claim 27 wherein the one or more wavelengths used to expose said positive tone photoresist layer are the same as the one or more wavelengths used to expose said negative tone photoresist layer.

32. A method of forming openings on a substrate, comprising:

forming a first photoresist layer on the substrate, wherein the first photoresist layer comprises first holes exposing the substrate;

thoroughly forming a second photoresist layer on the first photoresist layer to fill the first holes, wherein a material of the first photoresist layer is different from a material of the second photoresist layer;

patterning the second photoresist layer to remove a portion of the first photoresist layer within the first holes and form second-holes aligned above the first holes; and transferring the first holes into the substrate.

33. The method of claim 32, wherein the first photoresist layer further comprises a sidelobe and the sidelobe is filled with the second photoresist layer such that the sidelobe is not transferred into the substrate.

34. The method of claim 33, wherein the first photoresist layer comprises a positive photoresist material and the second photoresist layer comprises a negative photoresist material.

35. The method of claim 32, further comprising forming a sidelobe in the second photoresist layer, wherein the sidelobe is located directly above the first photoresist layer such that the sidelobe is not transferred into the substrate.

36. The method of claim 35, wherein the first photoresist layer comprises a negative photoresist material and the second photoresist layer comprises a positive photoresist material.

* * * * *